(12) United States Patent
Ogata et al.

(10) Patent No.: US 8,780,560 B2
(45) Date of Patent: Jul. 15, 2014

(54) LOOP HEAT PIPE, AND ELECTRONIC APPARATUS INCLUDING LOOP HEAT PIPE

(75) Inventors: Susumu Ogata, Isehara (JP); Hiroki Uchida, Isehara (JP); Seiji Hibino, Isehara (JP); Takeshi Shioga, Atsugi (JP); Takahiro Kimura, Isehara (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 13/567,257

(22) Filed: Aug. 6, 2012

(65) Prior Publication Data

US 2013/0044432 A1 Feb. 21, 2013

(30) Foreign Application Priority Data

Aug. 17, 2011 (JP) ................. 2011-178389

(51) Int. Cl.
*H05K 7/20* (2006.01)
*F28D 15/00* (2006.01)
*H01L 23/34* (2006.01)

(52) U.S. Cl.
USPC ............. 361/700; 165/104.21; 165/104.26; 165/104.33; 257/715; 174/15.2

(58) Field of Classification Search
CPC .......... G06F 1/16–1/1654; G06F 1/1656; G06F 1/1662–1/1681; G06F 1/20; G06F 1/203; G06F 1/206; G06F 2200/201; G06F 2200/202; G06F 2200/203; H05K 5/0026–5/0082; H05K 7/005–7/08; H05K 7/1422; H05K 5/00–5/0021; H05K 5/0086–5/06; H05K 5/069; H05K 7/20; H05K 1/0218–1/0219; H05K 1/00; H05K 3/00; H05K 7/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H02B 1/00; H01R 4/00; H01R 9/00; H01R 13/00; H01K 1/00; H01K 3/00
USPC ........... 361/700, 679.52; 165/104.21, 104.26, 165/104.33, 80.3; 174/15.2; 257/715, 257/E23.088
See application file for complete search history.

(56) References Cited

U.S. PATENT DOCUMENTS

| | | | |
|---|---|---|---|
| 7,692,926 B2 * | 4/2010 | Henderson et al. ........... | 361/701 |
| 7,738,248 B2 * | 6/2010 | Tomioka ................. | 361/679.52 |
| 8,550,150 B2 * | 10/2013 | Hou ........................ | 165/104.26 |
| 2010/0188818 A1 * | 7/2010 | Li ................................ | 361/700 |
| 2013/0083482 A1 * | 4/2013 | Uchida et al. ................. | 361/696 |

FOREIGN PATENT DOCUMENTS

JP 4459783 B2 4/2010

* cited by examiner

*Primary Examiner* — Zachary M Pape
*Assistant Examiner* — Razmeen Gafur
(74) *Attorney, Agent, or Firm* — Kratz, Quintos & Hanson, LLP

(57) ABSTRACT

There is provided a loop heat pipe which includes an evaporator that internally includes at least one wick built, a condenser, a liquid pipe and a vapor pipe that connect the evaporator and the condenser to each other, and a heat dispersion cavity that is formed inside the evaporator, and disperses a vapor, wherein the wick includes, a first wick that is porous, a second wick that is porous, the second wick being inserted into the first wick from the liquid pipe side and including a pore size larger than the first wick, and a vapor channel that is defined between the first wick and the second wick. The vapor channel is connected at an end on the liquid pipe side to the heat dispersion cavity.

11 Claims, 16 Drawing Sheets

FIG. 1A
RELATED ART
FIG. 1B
RELATED ART
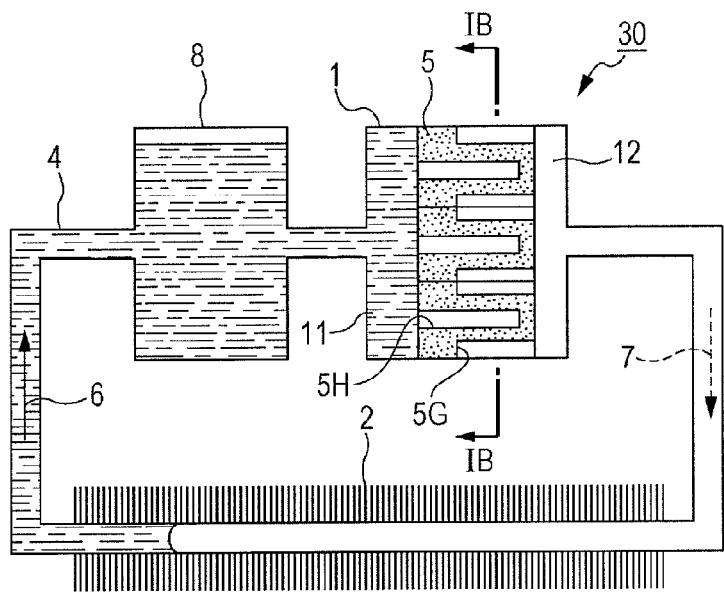
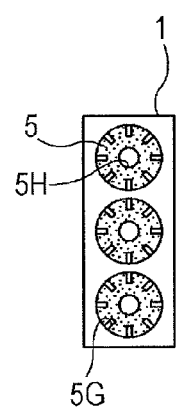
FIG. 1C
RELATED ART
FIG. 1D
RELATED ART
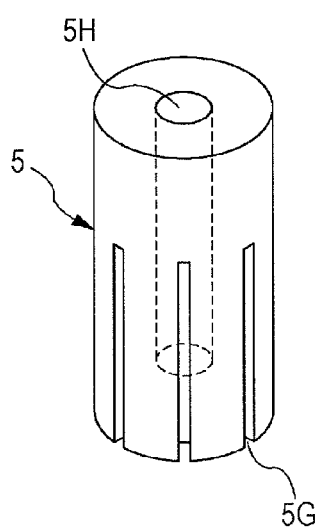
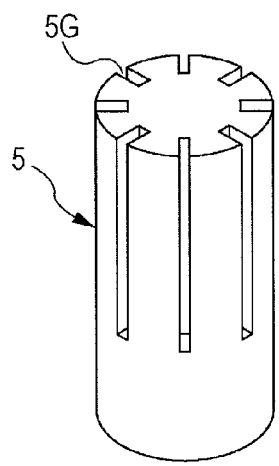

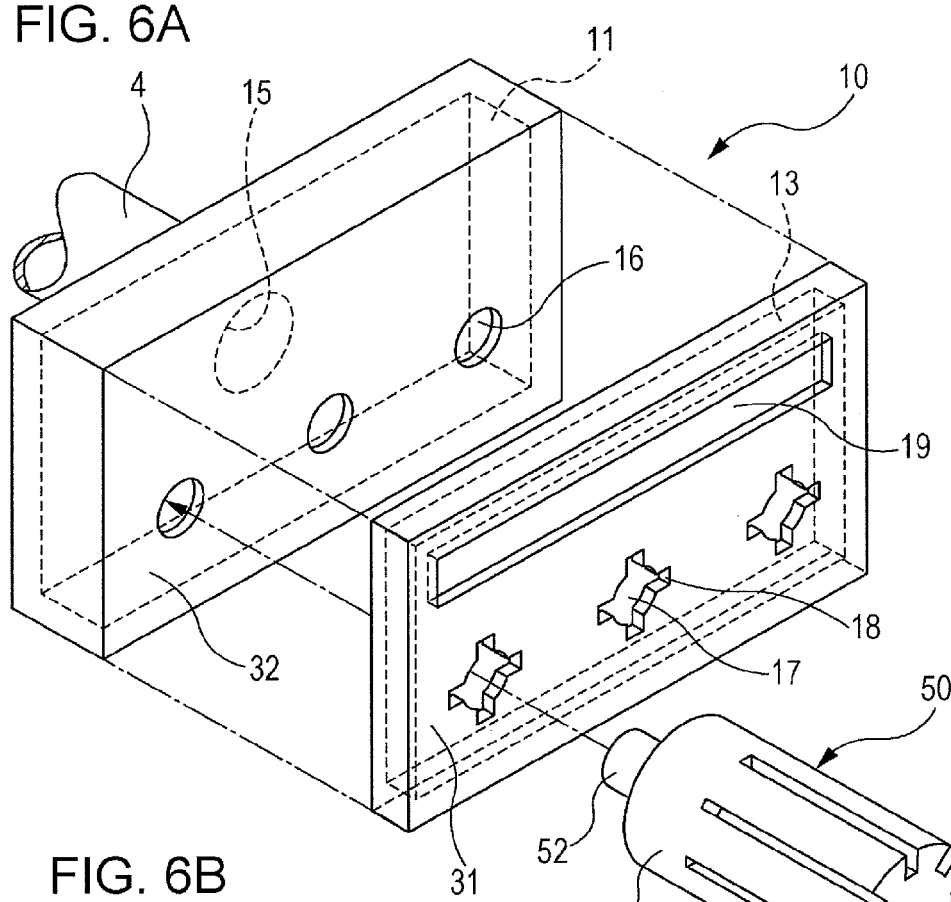
FIG. 6A
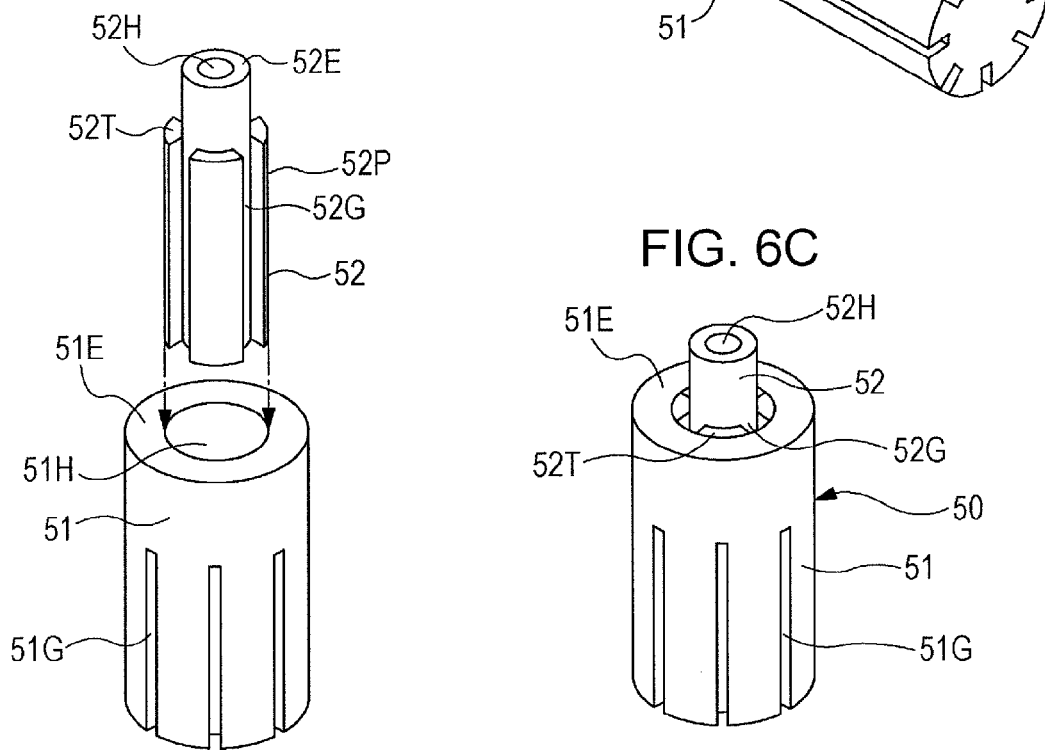
FIG. 6B
FIG. 6C

FIG. 10A1
FIG. 10B1
FIG. 10C1 RELATED ART
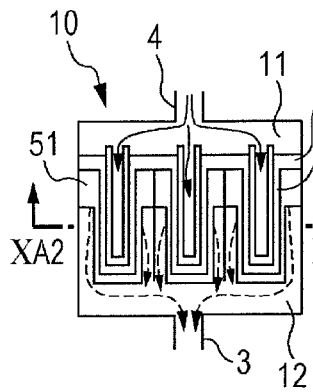
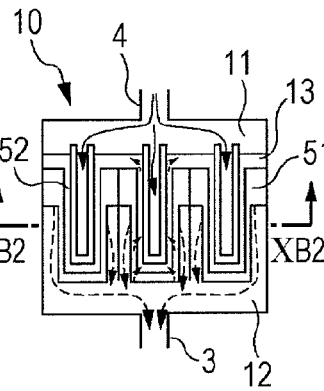
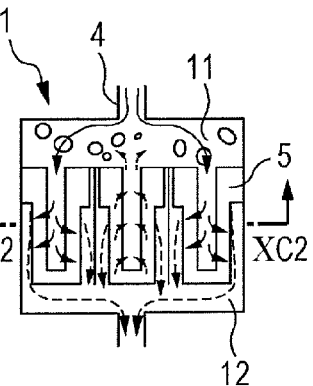
FIG. 10A2
FIG. 10B2
FIG. 10C2 RELATED ART
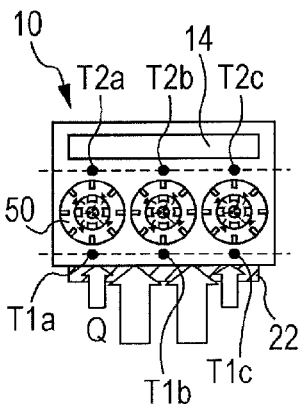
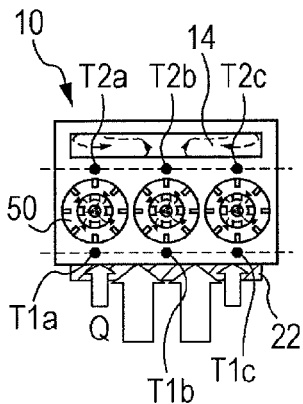
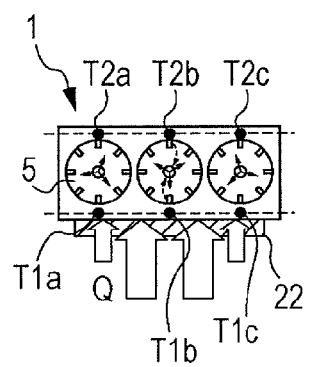
FIG. 10A3
FIG. 10B3
FIG. 10C3 RELATED ART
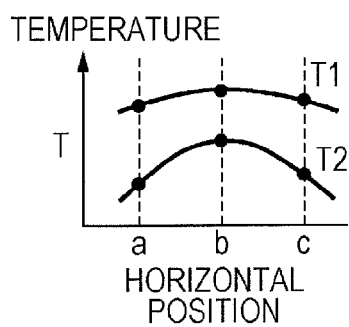
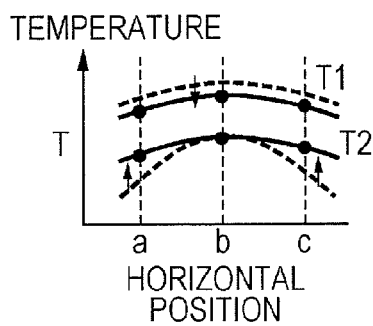
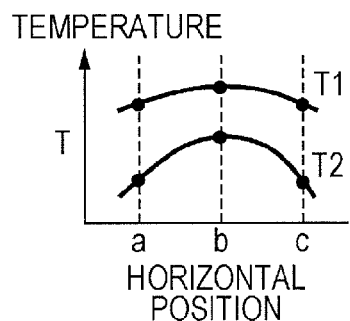
| WORKING FLUID |
| --- |
| ← —— LIQUID FLOW |
| ← ---- VAPOR FLOW |

FIG. 11A1
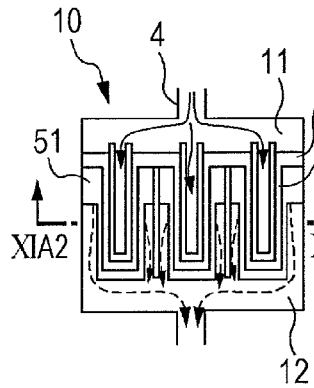
FIG. 11B1
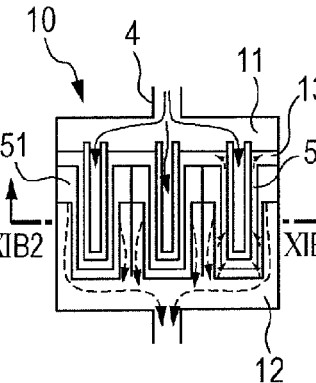
FIG. 11C1 RELATED ART
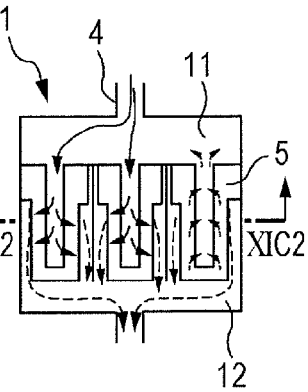
FIG. 11A2
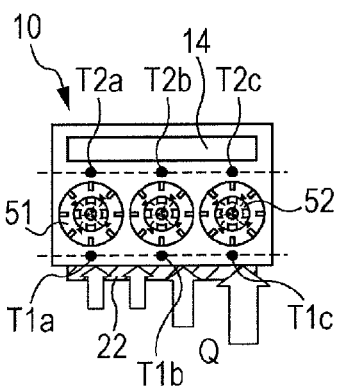
FIG. 11B2
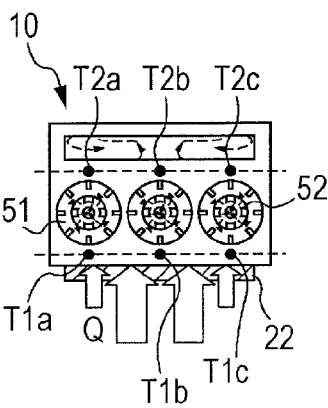
FIG. 11C2 RELATED ART
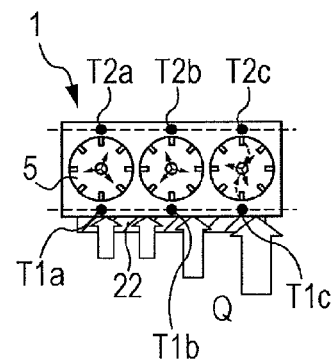
FIG. 11A3
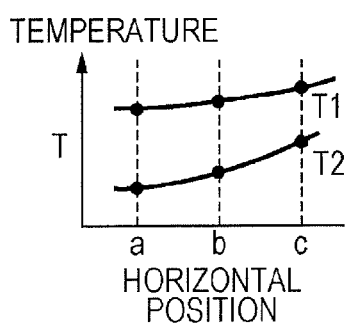
FIG. 11B3
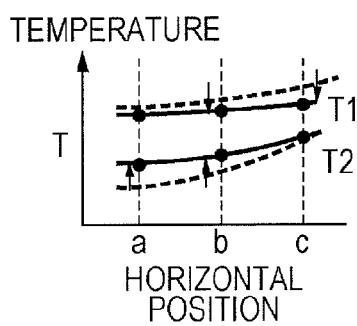
FIG. 11C3 RELATED ART
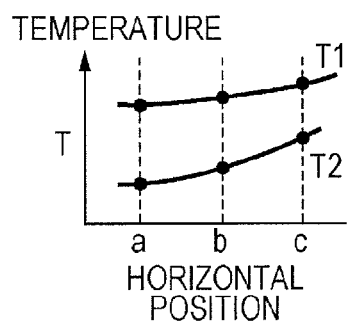
WORKING FLUID
— LIQUID FLOW
---- VAPOR FLOW $Q_{vin} = 0.3 \times 0.6 \times Q_{in}$
$= 0.18 Q_{in}$ $Q_{vflow} = Q_{vin} = 0.18 Q_{in}$

LOOP HEAT PIPE, AND ELECTRONIC APPARATUS INCLUDING LOOP HEAT PIPE

CROSS-REFERENCE TO RELATED APPLICATION

This application is based upon and claims the benefit of priority of the prior Japanese Patent Application No. 2011-178389, filed on Aug. 17, 2011, the entire contents of which are incorporated herein by reference.

FIELD

The embodiments discussed herein are related to a loop heat pipe, and an electronic apparatus including the loop heat pipe.

BACKGROUND

In the related art, there exist heat pipes which transport heat by the latent heat of a fluid (working fluid or operating fluid). Among these heat pipes, a loop heat pipe has an evaporator and a condenser that are connected to each other by a vapor pipe and a liquid pipe so as to form a loop. The evaporator causes the working liquid to evaporate when heated from the outside. The condenser causes vapor to condense by dissipating heat to the outside. Such configuration of a loop heat pipe (also called circulating loop heat pipe) is discussed in Japanese Patent No. 4,459,783 with reference to FIG. 1 thereof.

A loop heat pipe is a device that efficiently transports heat by utilizing latent heat produced by evaporation/condensation of a working fluid. A characteristic feature of a loop heat pipe is that the pressure difference between a working fluid in liquid phase and a working fluid in gaseous phase (vapor), and the capillary force of a wick works as the driving force, and thus no external electric power is used to transport heat. A loop heat pipe generally includes an evaporator with a wick built in to vaporize a working fluid, a compensation chamber that temporarily stores the working fluid, a condenser that turns the vapor of the working fluid into a liquid, and a transport pipe that connects the evaporator and the condenser to each other. Depending on the state of the working fluid flowing inside the transport pipe, the portion of the transport pipe which conveys a liquid from the condenser to the evaporator is called a liquid pipe, and the portion of the transport pipe that conveys a vapor from the evaporator to the condenser is called a vapor pipe.

A loop heat pipe with a plurality of evaporators built in a single evaporator section may transport heat by dispersing the amount of input heat among each of the evaporators, thereby enabling cooling of a high-heat generating element. Such a loop heat pipe is used to cool an electronic apparatus such as a computer. For example, this loop heat pipe is attached to an electronic component that is a high-heat generating element such as an integrated circuit mounted on a circuit board built in a computer, and cools the electronic component. A loop heat pipe with a plurality of wicks built in the evaporator is illustrated as FIGS. 1A and 1B.

A loop heat pipe 30 illustrated as FIGS. 1A and 1B has a plurality of wicks 5 (three wicks in this example) built in an evaporator 1. For example, the wicks 5 are made of a porous material using ceramic or nickel, or metal such as copper, copper oxide, or stainless steel as a raw material, or a porous material using a high polymer material such as polyethylene resin as a raw material. The evaporator 1 is provided with a liquid-side manifold 11 and a vapor-side manifold 12. The liquid-side manifold 11 supplies a working fluid 6 that has been returned from a compensation chamber 8 to each of the wicks 5. The vapor-side manifold 12 causes a vapor 7 generated from each of the wicks 5 to flow into a vapor pipe 3. At the interface between each of the wicks 5 and the case of the evaporator 1, heat propagates to the surface of the wick 5 from the case, causing the working fluid 6 that has seeped into the surface of the wick 5 to evaporate and turn into the vapor 7.

As illustrated as FIGS. 1C and 1D, the wick 5 has a cylindrical shape, and has a hollow 5H that opens at the liquid pipe 4 side. The hollow 5H defines a liquid channel that facilitates supply of the working fluid 6 to the outer periphery of the wick 5. On the outer periphery of the wick 5, a plurality of grooves 5G extend from the liquid pipe 4 side to the vapor pipe 3 side so that the vapor that has evaporated quickly moves to the vapor pipe 3. Each of the grooves 5G defines a vapor channel. The inside of the loop heat pipe 30 is completely evacuated first, and then filled with a liquid such as ammonia or a water-based, an alcohol based, hydrocarbon compound-based, or fluorine hydrocarbon compound-based liquid as the working fluid 6. In the wick 5 of the evaporator 1 applied with heat, the working fluid 6 in liquid phase turns into the vapor 7, and then flows through the vapor pipe 3. In the condenser 2, the vapor 7 turns into the working fluid 6 in liquid phase, and then returns to the evaporator 1. The capillary pressure of the wick 5 is used as a pumping pressure to cause the working fluid 6 to circulate between the evaporator 1 and the condenser 2.

FIG. 2 illustrates, in exploded view, the configuration of the evaporator 1 illustrated as FIGS. 1A and 1B. A wick accommodating section 1W is provided in the portion of the case between the liquid-side manifold 11 and the vapor-side manifold 12. Each of the wicks 5 is accommodated in the wick accommodating section 1W, forming the evaporator 1. A bottom 1B of the evaporator 1 is attached over an integrated circuit 22, which is a heat-generating circuit component mounted on a circuit board 21, via a heat spreader 23.

While the evaporator 1 configured as mentioned above may be manufactured by vertically segmenting the evaporator 1 as illustrated as FIG. 2, the evaporator 1 may be also manufactured by segmenting the evaporator 1 along the direction of flow of the working fluid 6 as illustrated as FIG. 3. In the manufacturing method illustrated as FIG. 3, the liquid-side manifold 11 that connects to the liquid pipe 4, the wick accommodating section 1W that accommodates the wick 5, and the vapor-side manifold 12 that connects to the vapor pipe 3 are first manufactured separately, and then joined together. The method of manufacturing the evaporator 1 by segmenting the evaporator 1 along the flow of the working fluid 6 as illustrated as FIG. 3 may achieve higher efficiency of heat transfer to the wick 5, because a gap is less likely to develop between the wick 5 and the wick accommodating section 1W.

FIG. 4A illustrates the operations of the evaporator 1 and compensation chamber 8 when heat input to the evaporator 1 illustrated as FIGS. 1A, 2, and 3 from the integrated circuit 22 is uniform. FIG. 4B illustrates a local cross-section taken along the line IVB-IVB in FIG. 4A. Now, let T1 be the temperature on the integrated circuit 22 side of the evaporator 1, and let T2 be the temperature on the side opposite to the integrated circuit 22 (Let T2$a$, T2$b$, and T2$c$ be the temperatures in corresponding areas of the evaporator 1 above the three wicks 5). In a case where there is uniform heat input from the integrated circuit 22, and the heat inputted to the evaporator 1 is dispersed among each of the wicks 5, the temperatures T2$a$, T2$b$, and T2$c$ in the areas of the evaporator 1 above the corresponding wicks 5 are substantially equal. In this case, the difference in the amount of vapor generated in each of the wicks 5 is small, and also, the working fluid 6 that has been returned is supplied in accordance with the amount of vapor. Thus, the evaporator 1 operates properly.

An example of a loop heat pipe is disclosed in, for example, JP 4459783, in which FIG. 1 illustrates an overall configuration of the loop heat pipe.

SUMMARY

According to an aspect of the invention, a loop heat pipe includes an evaporator that internally includes at least one wick built, a condenser, a liquid pipe and a vapor pipe that connect the evaporator and the condenser to each other, and a heat dispersion cavity that is formed inside the evaporator, and disperses a vapor, wherein the wick includes, a first wick that is porous, a second wick that is porous, the second wick being inserted into the first wick from the liquid pipe side and including a pore size larger than the first wick, and a vapor channel that is defined between the first wick and the second wick, and wherein the vapor channel is connected at an end on the liquid pipe side to the heat dispersion cavity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A illustrates the configuration of a loop heat pipe according to the related art which has three wicks built in an evaporator;

FIG. 1B is a cross-sectional view taken along the line IB-IB in FIG. 1A;

FIG. 1C is a perspective view of one of the wicks built in the evaporator illustrated as FIG. 1A as seen from the inlet side of a working fluid;

FIG. 1D is a perspective view of one of the wicks built in the evaporator illustrated as FIG. 1A as seen from the outlet side of the working fluid;

FIG. 6A is a perspective main-portion assembly view illustrating how to attach a wick including first and second wicks in the evaporator according to the disclosure;

FIG. 6B is a perspective assembly view illustrating the configuration of the wick illustrated as FIG. 6A;

FIG. 6C is a perspective view of the wick assembled as illustrated as FIG. 6B as seen from the second wick side;

FIGS. 10A1 to 10A3 are a plan view illustrating the operation of the evaporator according to the disclosure, a cross-sectional view taken along the line XA2-XA2, and a temperature characteristic diagram representing temperature distributions in various parts of the evaporator, respectively, immediately after non-uniform heat input is made from the heat-generating circuit component, which are presented in a vertically arranged manner;

FIGS. 10B1 to 10B3 are a plan view illustrating the operation of the evaporator according to the disclosure, a cross-sectional view taken along the line XB2-XB2, and a temperature characteristic diagram representing temperature distributions in various parts of the evaporator, respectively, when a given period of time has elapsed since the non-uniform heat input from the heat-generating circuit component, which are presented in a vertically arranged manner;

FIGS. 10C1 to 10C3 are a plan view illustrating the operation of the evaporator according to the related art, a cross-sectional view taken along the line XC2-XC2, and a temperature characteristic diagram representing temperature distributions in various parts of the evaporator, respectively, immediately after uniform heat input is made from the heat-generating circuit component, which are presented in a vertically arranged manner;

FIGS. 11A1 to 11A3 are a plan view illustrating the operation of the evaporator according to the disclosure, a cross-sectional view taken along the line XIA2-XIA2, and a temperature characteristic diagram representing temperature distributions in various parts of the evaporator, respectively, immediately after another non-uniform heat input is made from the heat-generating circuit component, which are presented in a vertically arranged manner;

FIGS. 11B1 to 11B3 are a plan view illustrating the operation of the evaporator according to the disclosure, a cross-sectional view taken along the line XIB2-XIB2, and a temperature characteristic diagram representing temperature distributions in various parts of the evaporator, respectively, when a given period of time has elapsed since the other non-uniform heat input from the heat-generating circuit component, which are presented in a vertically arranged manner;

FIGS. 11C1 to 11C3 are a plan view illustrating the operation of the evaporator according to the related art, a cross-sectional view taken along the line XIC2-XIC2, and a temperature characteristic diagram representing temperature distributions in various parts of the evaporator, respectively, immediately after non-uniform heat input is made from the heat-generating circuit component, which are presented in a vertically arranged manner;

DESCRIPTION OF EMBODIMENTS

There is some problem with the configuration described in the background as explained below. In a case where the inputted heat is not dispersed sufficiently, such as when the integrated circuit 22 generates high heat or when, as illustrated as FIG. 4D, the distribution of heat input from the integrated circuit 22 is non-uniform, the heat input concentrates on a specific one of the wicks 5. While there is more evaporation from the wick 5 on which the heat input concentrates (the wick 5 illustrated in FIG. 4D) in comparison to the other wicks 5, at the same time, the amount of heat passing through the wick 5 increases, resulting in an increase in the amount of vapor generated inside the wick 5.

Figure 4A:
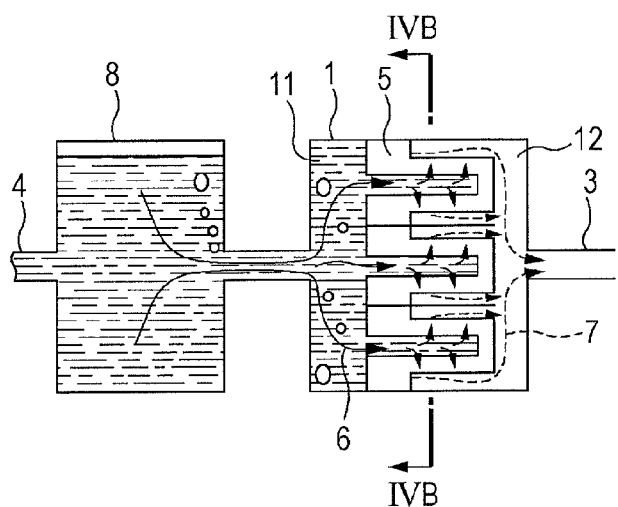
FIG. 4A illustrates the operations of the evaporator and compensation chamber when heat input to the evaporator illustrated as FIG. 1A is uniform.
Figure 4B:
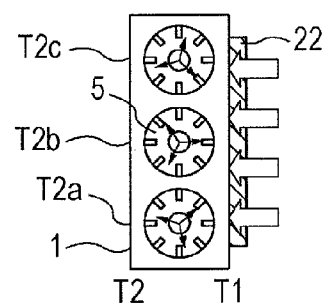
FIG. 4B illustrates a local cross-section taken along the line IVB-IVB in FIG. 4A, and uniform heat input from the heat-generating circuit component.
Figure 4C:
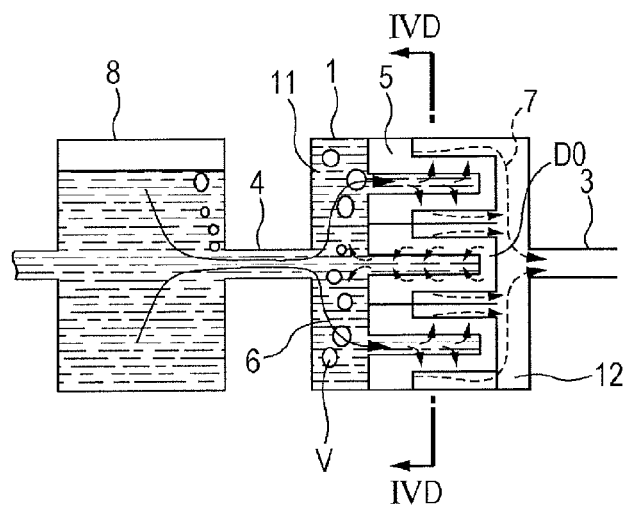
FIG. 4C illustrates the operations of the evaporator and compensation chamber when heat input to the evaporator illustrated as FIG. 1A is non-uniform.
Figure 4D:
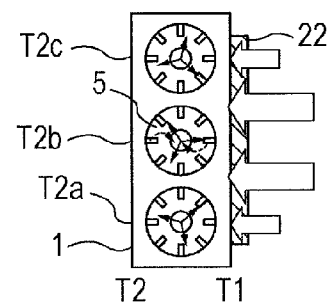
FIG. 4D illustrates a local cross-section taken along the line IVD-IVD in FIG. 4C, and non-uniform heat input from the heat-generating circuit component.

The vapor generated inside the wick 5 blocks flow of the working fluid 6 into the wick 5 when flowing backward to the liquid-side manifold 11 as illustrated as FIG. 4C, causing shortage of fluid supply to the wick 5. When there is shortage of fluid supply to the wick 5, the working fluid 6 does not sufficiently seep into the wick 5, producing an area where the working fluid 6 becomes dry in a part of the wick 5. In the area where the working fluid 6 has not seeped into the wick 5, no check valve action due to capillary force takes place. Thus, the vapor 7 on the vapor pipe 3 side penetrates into the wick 5, which further increases the amount of vapor inside the wick 5. As a result, despite the large amount of evaporation, the wick 5 of the evaporator 1 on which heat input has concentrated suffers from shortage of fluid supply, which eventually causes dry-out DO in which the entire wick 5 is exhausted. Also, in a case where a large amount of vapor V is produced from the inside of the wick 5, this vapor V diffuses into the liquid-side manifold 11, which also impedes fluid supply to the other wicks 5, causing deterioration of the cooling performance of the evaporator 1 as a whole.

In the embodiments discussed below, a fluid transport device (loop heat pipe) that transports a fluid, and an electronic apparatus including a loop heat pipe are described.

Hereinafter, embodiments are described in detail with reference to the attached drawings on the basis of specific examples. In the following description, components that are the same as those of the loop heat pipe 30 according to the related art are denoted by the same symbols.

Figure 2:
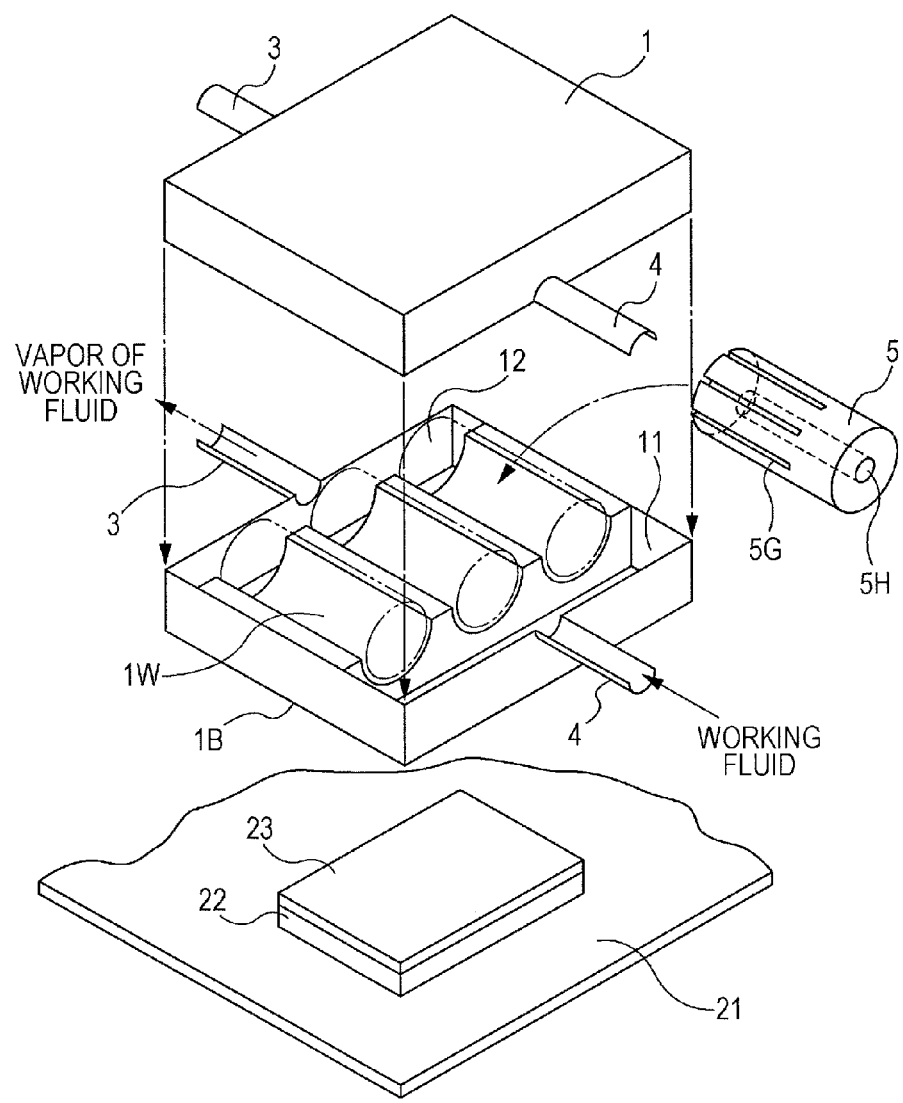
FIG. 2 is an exploded perspective view illustrating the configuration of the evaporator illustrated as FIG. 1A, presented in a vertically segmented fashion, and a heat-generating circuit component provided on a circuit board to which the evaporator is attached.
Figure 5:
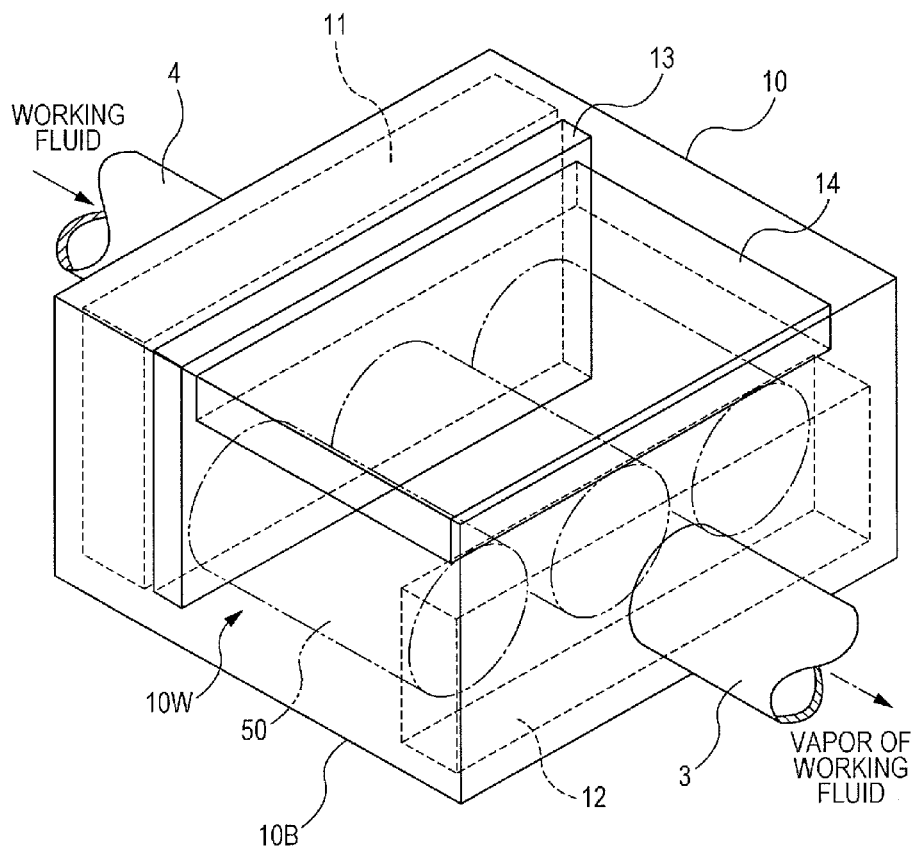
FIG. 5 is a see-through perspective view of an evaporator, illustrating the position of a heat dispersion cavity provided in the evaporator of a loop heat pipe according to the disclosure.

FIG. 5 is a see-through perspective view of an evaporator for explaining the position of a heat dispersion cavity provided in an evaporator of the loop heat pipe 30 according to the disclosure. For example, an evaporator 10 differs from the evaporator 1 according to the related art illustrated as FIG. 2 in the configuration of each of wicks 50 accommodated in a wick accommodating section 10W corresponding to the wick accommodating section 1W according to the related art, and provision of a heat dispersion cavity 14 near the wick accommodating section 10W. An example of the structure of the wick 50 is described later. First, the heat dispersion cavity 14 is described.

As described above with reference to FIG. 2, in the evaporator 1 according to the related art, only the wick accommodating section 1W is provided between the liquid-side manifold 11 that branches the working fluid 6 supplied from the liquid pipe 4 to the three wicks 5, and the vapor-side manifold 12 that collects the vapor of the working fluid 6 and directs the collected vapor to the vapor pipe 3. In the evaporator 10, for example, a communication channel 13 is provided between the wick accommodating section 10W and the liquid-side manifold 11, and further, the heat dispersion cavity 14 is provided between the side of the evaporator 10 opposite to a bottom 10B, and the wick accommodating section 10W. The heat dispersion cavity 14 is, for example, a closed cavity that covers the area above three wicks 50 in this embodiment. An end on the liquid pipe 4 side of the heat dispersion cavity 14 communicates with the communication channel 13.

Next, an example of the configuration of the wick 50 is described with reference to FIGS. 6A to 6C. As illustrated as FIG. 6B, the wick 50 includes, for example, a first wick 51 and a second wick 52. The first wick 51 has a cylindrical shape. Like the wick 5 according to the related art, the first wick 51 includes a hollow 51H on the liquid pipe 4 side, and a groove 51G that serves as a vapor channel on the vapor pipe 3 side. For example, the second wick 52 is inserted into the first wick 51, and is in the shape of a cylinder narrower than the first wick 51. The second wick 52 has a hollow 52H provided on the liquid pipe 4 side, and a protrusion 52P provided at given intervals on its side face on the vapor pipe 3 side. The protrusion 52P has a length shorter than the depth of the hollow 51H provided in the first wick 51. The portion between the protrusion 52P and the protrusion 52P defines a groove 52G serving as a vapor channel in the second wick 52.

The outer periphery of the protrusion 52P provided on the second wick 52 is a circumferential face that is concentric with the center axis of the second wick 52. The outer periphery of the protrusion 52P may be fitted with no gap in the inner periphery of the hollow 51H of the first wick 51. FIG. 6C is a perspective view of the wick 50 assembled as illustrated in FIG. 6B as seen from the second wick 52 side. That is, FIG. 6C illustrates an example of a state in which the outer periphery of the protrusion 52P provided on the second wick 52 is fitted in the hollow 51H of the first wick 51. In this state, one corresponding groove 51G of the first wick 51 is located on the radially outer side of the groove 52G in the second wick 52. An end 52T of the protrusion 52P is flush with an end face 51E of the first wick 51.

As illustrated as FIG. 6A, for example, a first partition wall 31 is provided in the portion between the communication channel 13 and the heat dispersion cavity 14 illustrated as FIG. 5. The first partition wall 31 has a second-wick insertion hole 17, a groove communication hole 18, and a heat-dissipation-cavity communication hole 19. The cylindrical portion of the second wick 52 projecting from the first wick 51 is inserted through the second-wick insertion hole 17. The groove communication hole 18 communicates with the groove 52G of the second wick 52. The heat-dissipation-cavity communication hole 19 communicates with the heat dispersion cavity 14. Also, for example, a second partition wall 32 is provided in the portion between the liquid-side manifold 11 and the communication channel 13. The second partition wall 32 has a second-wick attaching hole 16. The cylindrical portion of the second wick 52 projecting from the first wick 51 is inserted through the second-wick attaching hole 16 to be fixed in place. Symbol 15 denotes the inlet of the working fluid 6 to the liquid-side manifold 11 from the liquid pipe 4.

In the wick 50, for example, the cylindrical portion of the second wick 52 projecting from the first wick 51 is inserted through the second-wick insertion hole 17, and then inserted into the second-wick attaching hole 16. At this time, the end face 51E of the first wick 51 comes into intimate contact with the first partition wall 31, and all of the grooves 52G of the second wick 52 overlap the groove communication hole 18 provided in the first partition wall 31. In a state in which the wick 50 is secured to the first partition wall 31, the grooves 52G of the second wicks 52 of the three wicks 50 all communicate with the heat dispersion cavity 14 illustrated as FIG. 5 via the groove communication hole 18, the communication channel 13, and the heat-dissipation-cavity communication hole 19.

Figure 7A:
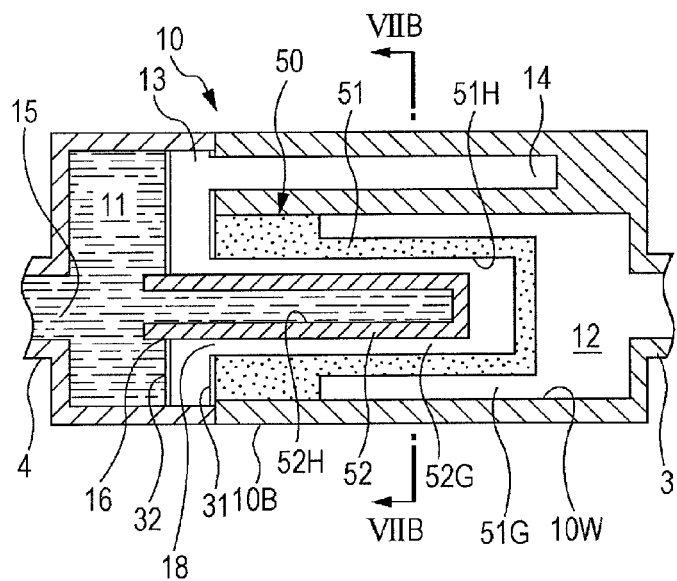
FIG. 7A is a cross-sectional view of an embodiment of the evaporator according to the disclosure.
Figure 7B:
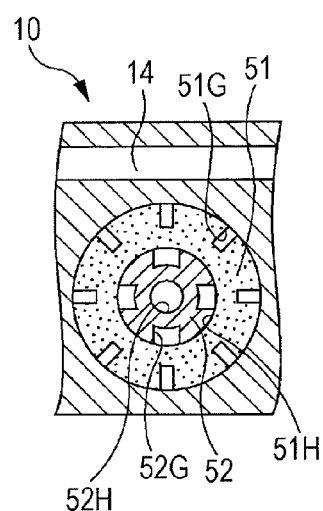
FIG. 7B is a main-portion cross-sectional view taken along the line VIIB-VIIB in FIG. 7A.

FIG. 7A is a cross-sectional view of an embodiment of the evaporator 10 according to the disclosure, and FIG. 7B is a main-portion cross-sectional view taken along the line VIIB-VIIB in FIG. 7A. FIGS. 7A and 7B each illustrate a cross section of one of the wicks 50 installed in an embodiment of the evaporator 10 according to the disclosure as illustrated as FIG. 5 and FIGS. 6A to 6C. As mentioned above, the wick 50 is accommodated in the wick accommodating section 10W of the evaporator 10 so as to be in contact with the case of the evaporator 10, with the second wick 52 inserted inside the first wick 51 that causes the working fluid 6 to evaporate. The outer surface of the second wick 52 is provided with the groove 52G as a vapor channel for removing vapor generated inside the first wick 51. For example, the groove 52G of the second wick 52 communicates with the communication channel 13 that is a vapor collection section provided between the liquid-side manifold 11 and the wick 50. Further, the communication channel 13 communicates with the heat dispersion cavity 14 that is provided on the side of the evaporator 10 opposite to the bottom (heating side) 10B.

Figure 7C:
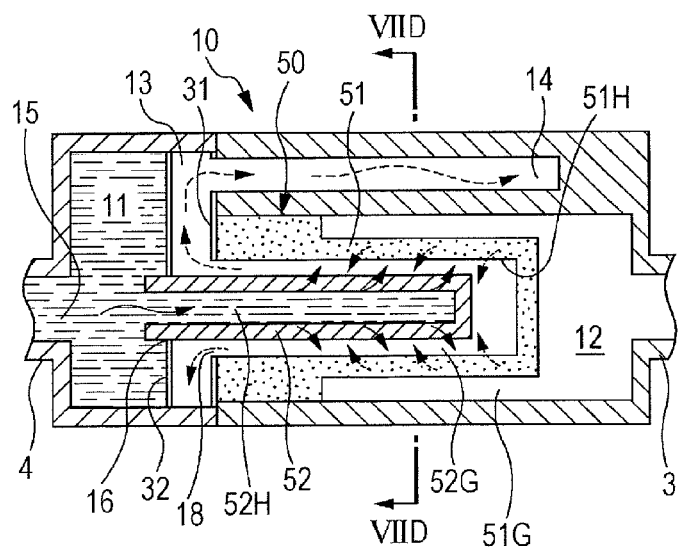
FIG. 7C is a cross-sectional view illustrating the operation of the evaporator according to the disclosure illustrated as FIG. 7A.
Figure 7D:
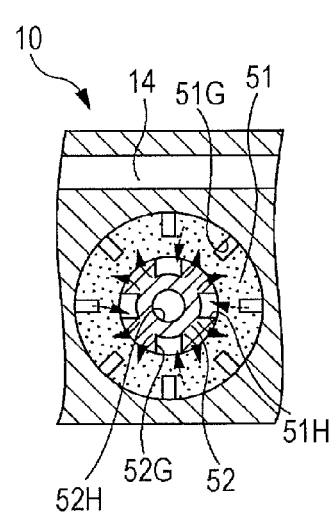
FIG. 7D is a main-portion cross-sectional view taken along the line VIID-VIID in FIG. 7C.

The boundary between the liquid-side manifold 11 and the communication channel 13 is made airtight so as to decrease leakage of vapor between the liquid-side manifold 11 and the communication channel 13. As illustrated as FIG. 7C, the working fluid 6 moves to the first wick 51 from the liquid-side manifold 11 via the second wick 52. Since the capillary force of the first wick 51 is used as the driving force to move the working fluid 6, the pore size of the first wick 51 is set smaller than the pore size of the second wick 52. The working fluid 6 that has seeped through the second wick 52 seeps into the first wick 51 as indicated by arrows in FIG. 7D, via the contact area between the second wick 52 and the first wick 51.

The above-mentioned structure makes it possible to send the vapor generated in the first wick 51 to the heat dispersion cavity 14, via the groove 52G provided in the surface of the second wick 52 and the communication channel 13 provided adjacent to the liquid-side manifold 11. Since the heat dispersion cavity 14 communicates with the groove 52G of another adjacent wick 50 via the communication channel 13, the vapor diffuses into the heat dispersion cavity 14, thereby allowing heat to distribute uniformly over the entire evaporator 10.

When supplying the working fluid 6 from the second wick 52 to the first wick 51, the difference in capillary force between the first and second wicks 51 and 52 works as the driving force for the fluid supply. The capillary force P is expressed as $P = 2\sigma \cos \theta / r$, where $\sigma$ is the surface tension of the working fluid, $\theta$ is the contact angle between the working fluid 6 and the wick 50, and r is the pore radius of the wick 50. In order for the working fluid 6 to be supplied from the second wick 52 to the first wick 51, the first wick 51 is to be smaller in pore diameter, and hence greater in capillary force, than the second wick 52.

As the working fluid 6 seeps into the wick 50, a meniscus forms in the pore portion of the wick 50, acting as a check valve. The maximum backflow pressure that may be suppressed is equal to the capillary force. Hence, the maximum backflow pressure that may be suppressed is lower for the second wick 52 than for the first wick 51. Therefore, the structure illustrated as FIGS. 7A and 7B is to be operated in such a way to ensure that the vapor generated between the first wick 51 and the second wick 52 does not penetrate the second wick 52.

If the vapor generated between the first wick 51 and the second wick 52 penetrates the second wick 52, the performance of the evaporator 10 according to the disclosure deteriorates as in the case of the evaporator 1 according to the related art. Accordingly, in the evaporator 10 according to the disclosure, to minimize performance deterioration of the evaporator 10 due to penetration of vapor through the second wick 52, for example, the groove 52G of the second wick 52 is covered with a non-porous plate 33 so that the vapor generated inside the first wick 51 does not penetrate the second wick 52.

Figure 8A:
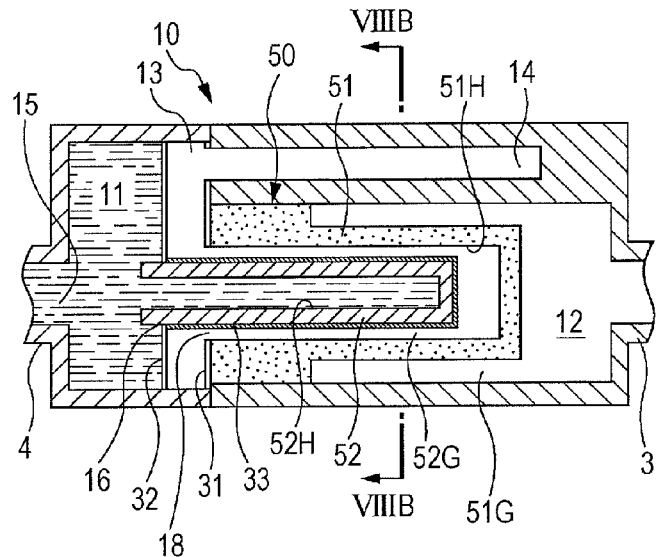
FIG. 8A is a cross-sectional view of a modified embodiment of the evaporator according to the disclosure.
Figure 8B:
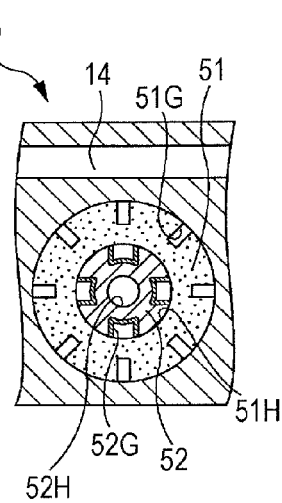
FIG. 8B is a main-portion cross-sectional view taken along the line VIIIB-VIIIB in FIG. 8A.

FIG. 8A is a cross-sectional view of a modified embodiment of the evaporator 10 according to the disclosure. FIG. 8B is a main-portion cross-sectional view taken along the line VIIIB-VIIIB in FIG. 8A. As an embodiment, FIGS. 8A and 8B illustrate the evaporator 10 including the non-porous plate 33 provided to the groove 52G to suppress penetration of vapor through the second wick. Since the configuration of the evaporator 10 other than the non-porous plate 33 has already been described above with reference to FIGS. 7A and 7B, a description of such configuration is omitted here.

Figure 8C:
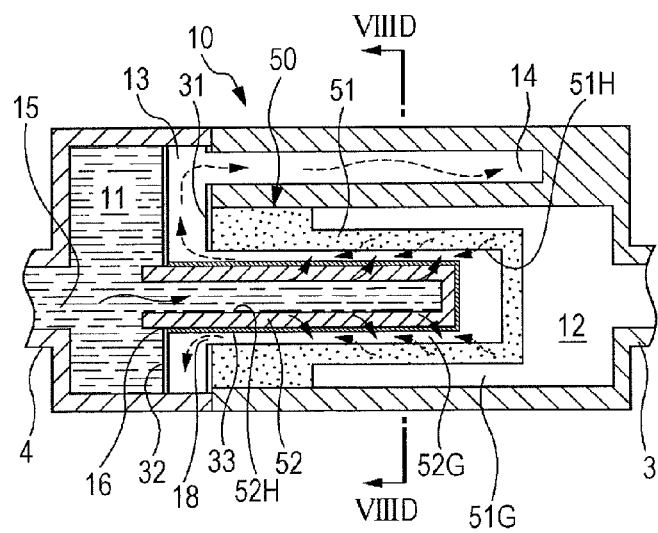
FIG. 8C is a cross-sectional view illustrating the operation of the evaporator according to the disclosure illustrated as FIG. 8A.
Figure 8D:
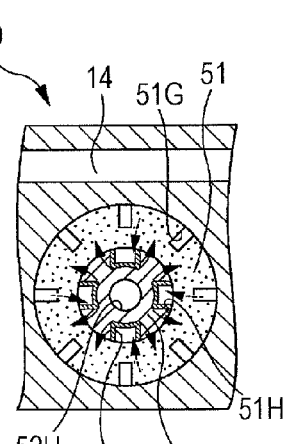
FIG. 8D is a main-portion cross-sectional view taken along the line VIIID-VIIID in FIG. 8C.

In a case where the groove 52G is provided with the non-porous plate 33 to suppress penetration of vapor through the second wick as illustrated as FIGS. 8A and 8B, the vapor generated inside the first wick 51 does not penetrate the non-porous plate 33 as illustrated as FIGS. 8C and 8D. Consequently, the entire amount of vapor generated inside the first wick 51 moves to the heat dispersion cavity 14 without penetrating into the second wick 52, thereby making it possible to minimize performance deterioration of the evaporator 10 due to penetrating of the vapor into the second wick 52.

Figure 9A:
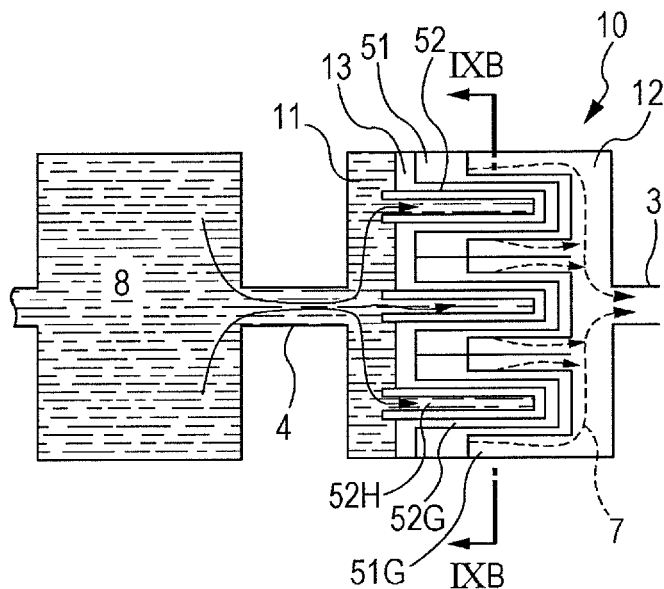
FIG. 9A illustrates the operations of the evaporator and compensation chamber when heat input to the evaporator illustrated as FIG. 8A is uniform.
Figure 9B:
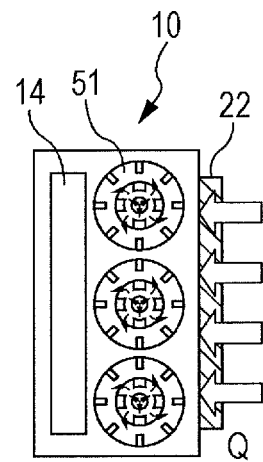
FIG. 9B illustrates a local cross-section taken along the line IXB-IXB in FIG. 9A, and uniform heat input from the heat-generating circuit component.
Figure 9C:
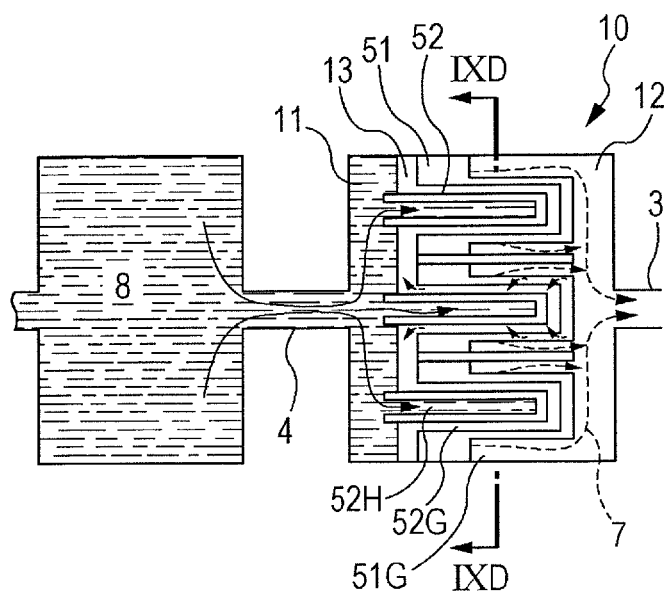
FIG. 9C illustrates the operations of the evaporator and compensation chamber when heat input to the evaporator illustrated as FIG. 8A is non-uniform.
Figure 9D:
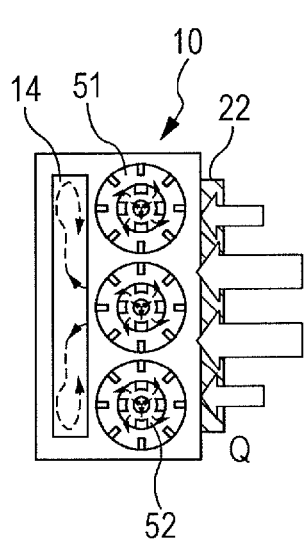
FIG. 9D illustrates a local cross-section taken along the line IXD-IXD in FIG. 9, and non-uniform heat input from the heat-generating circuit component.

FIGS. 9A and 9B illustrate the operations of the evaporator 10 and compensation chamber 8 when the heat input Q to the evaporator 10 illustrated as FIGS. 8A and 8B is uniform. Also, FIGS. 9C and 9D illustrate the operations of the evaporator 10 and compensation chamber 8 when the heat input Q to the evaporator 10 illustrated as FIGS. 8A and 8B is non-uniform. In a case where the heat input Q is uniform, the evaporator 10 according to the disclosure functions in the similar manner as the evaporator 1 according to the related art.

In a case where the heat input Q to the evaporator 10 is non-uniform as illustrated as FIG. 9D, in the related art, owing to the inability to sufficiently disperse heat, vapor forms inside the wick 5 on which heat concentrates. However, in the case of the evaporator 10, even when the heat input Q is non-uniform as illustrated as FIG. 9D, for example, the vapor generated inside the wick 50 is released to the heat dispersion cavity 14 through the groove 52G on the outer periphery of the second wick 52, thereby allowing heat to distribute uniformly over the entire evaporator 10. As a result, concentration of the heat input Q on a specific wick 50 is mitigated, and heat is dispersed toward to the other wicks 50, reducing the possibility of a decrease in evaporation capability in a specific wick 50 due to concentration of the heat input Q. Since the vapor generated inside the wick 50 does not interfere with the channel for the working fluid 6, supply of the working fluid 6 is not blocked, thereby suppressing exhaustion (i.e. dry-out) of the wick 50.

Figure 3:
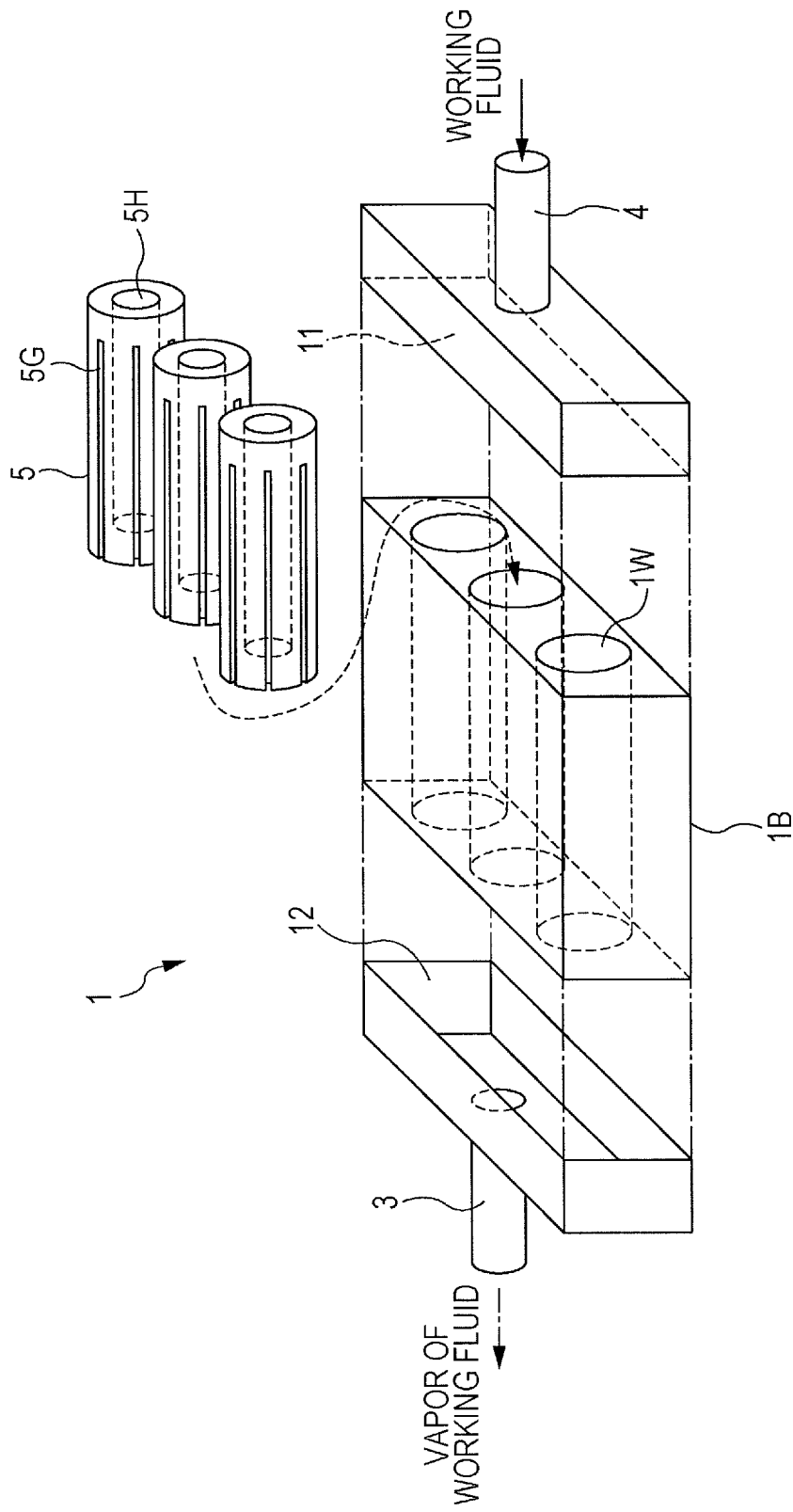
FIG. 3 is an exploded perspective view of the evaporator illustrated as FIG. 1A which is segmented along the direction of flow of the working fluid.

FIGS. 10A1 to 10A3 illustrate the operation of the evaporator 10 according to the disclosure, a cross-section of the evaporator 10, and temperature characteristics representing temperature distributions in various parts of the evaporator 10, respectively, immediately after non-uniform heat input Q with high temperature in the middle is made from the integrated circuit 22 that is a heat-generating circuit component. FIGS. 10A1 to 10A3 are presented in a vertically arranged manner. Also, FIGS. 10B1 to 10B3 illustrate the same as those mentioned above in a state in which heat is dispersed after a given period of time has elapsed since the non-uniform heat input Q with high temperature in the middle, which is illustrated as FIGS. 10A1 to 10A3. Further, FIGS. 10C1 to 10C3 illustrate the same as those mentioned above in the evaporator 1 according to the related art after the given period of time has elapsed since the non-uniform heat input Q with high temperature in the middle. The given period of time represents the time it takes for the heat dispersion cavity 14 to exert its uniform heat distribution capability. In FIGS. 10A1 to 10C3, T1 denotes the temperature of the evaporator 1, 10 on the heat input Q side, T2 denotes the temperature of the evaporator 1, 10 on the side opposite to the heat source, and a, b, and c each denote a location in the evaporator 1, 10.

In a case where the heat input Q from the integrated circuit 22 concentrates in the middle of the evaporator 10, as illustrated as FIGS. 10A1 to 10A3, the temperature T2b in the middle of the evaporator 10 on the side opposite to the heat source rises. However, after elapse of the given period of time, the heat dispersion cavity 14 acts to distribute heat uniformly over the entire evaporator 10. Consequently, as illustrated in FIG. 10B3, the temperature T2b in the middle of the evaporator 10 on the side opposite to the heat source becomes not much different from temperatures T2a and T2c at the left and right of the evaporator 10 on the side opposite to the heat source. The temperature T1b in the middle of the evaporator 10 on the heat source side also becomes not much different from temperatures T1a and T1c at the left and right of the evaporator 10 on the heat source side. Also, the evaporation temperature of each wick 50 drops and, as a result, the temperature of the evaporator 10 also drops. Further, the vapor generated inside the wick 50 does not move to the compensation chamber 8 side, and thus the temperature of the working fluid 6 supplied to the wick 50 does not rise. As a result, it is possible to keep the evaporation temperature low, and also the temperature T1 drops. In contrast, as illustrated as FIGS. 10C1 to 10C3, the evaporator 1 according to the related art is not provided with the heat dispersion cavity 14, so the temperature T2b in the middle of the evaporator 1 on the side opposite to the heat source remains high.

FIGS. 11A1 to 11A3 illustrate the operation of the evaporator 10 according to the disclosure, a cross-section of the evaporator 10, and temperature characteristics representing temperature distributions in various parts of the evaporator 10, respectively, immediately after non-uniform heat input Q with high temperature at one end is made from the integrated circuit 22 that is a heat-generating circuit component. FIGS. 11A1 to 11A3 are presented in a vertically arranged manner. Also, FIGS. 11B1 to 11B3 illustrate the same as those mentioned above in a state in which heat is dispersed after a given period of time has elapsed since the non-uniform heat input Q with high temperature at one end which is illustrated as FIGS. 11A1 to 11A3. Further, FIGS. 11C1 to 11C3 illustrate the same as those mentioned above in the evaporator 1 according to the related art after the given period of time has elapsed since the non-uniform heat input Q with high temperature at one end. As in FIGS. 10A1 to 10C3, T1 denotes the temperature of the evaporator 1, 10 on the heat input side, T2 denotes the temperature of the evaporator 1, 10 on the side opposite to the heat source, and a, b, and c each denote a location in the evaporator 1, 10.

In a case where the heat input Q from the integrated circuit 22 concentrates at one end of the evaporator 10, as illustrated as FIGS. 11A1 to 11A3, the temperature T2c at one end of the evaporator 10 on the side opposite to the heat source rises. However, after elapse of the given period of time, the heat dispersion cavity 14 acts to distribute heat uniformly over the entire evaporator 10. Consequently, the temperature T2c at one end of the evaporator 10 on the side opposite to the heat source becomes not much different from temperatures T2a and T2b at the other end and in the middle of the evaporator 10 on the side opposite to the heat source as illustrated as FIGS. 11B3. The temperature T1c at one end of the evaporator 10 on the heat source side also becomes not much different from temperatures T1a and T1b at the other end and in the middle of the evaporator 10 on the heat source side. Also, the evaporation temperature of each wick 50 drops, and the temperature of the evaporator 10 also drops. Further, the vapor generated inside the wick 50 does not move to the compensation chamber 8 side, and thus the temperature of the working fluid 6 supplied to the wick 50 does not rise. As a result, it is possible to keep the evaporation temperature low, and also the temperature T1 drops. In contrast, as illustrated as FIGS. 11C1 to 11C3, the evaporator 1 according to the related art is not provided with the heat dispersion cavity 14, so the temperature T2c at one end of the evaporator 1 on the side opposite the heat source remains high.

From the foregoing, in the related art, the temperature near the portion of the evaporator 1 where the heat input Q concentrates becomes high in comparison to temperatures near other portions of the evaporator 1. As a result of this temperature distribution, the difference in the amount of evaporation among various parts of the evaporator 1 becomes large, causing deterioration of heat transport performance as mentioned above. In the case of the loop heat pipe 30 according to the disclosure, although a non-uniform temperature distribution develops in the evaporator 10 immediately after the heat input Q is made as in the related art, as the vapor generated inside the first wick 51 flows into the heat dispersion cavity 14, the temperature on the side opposite to the heat source becomes uniform, and concentration of the heat input Q is mitigated. As heat is inputted to each wick 50 in a dispersed manner, the evaporation temperature in each wick 50 drops and, as a result, the temperature of the evaporator 10 drops. Further, unlike in the related art, the vapor generated inside the wick 50 does not move to the compensation chamber 8 side. Consequently, the temperature of the liquid supplied to the wick 50 does not rise, making it possible to also keep the evaporation temperature low.

As already described above, in the related art, when a large amount of vapor V is generated from inside one wick 5, the vapor V diffuses in the liquid-side manifold 11, and supply of fluid to the other wicks 5 is thus blocked, causing deterioration of cooling performance. Hereinafter, generation of vapor V and deterioration of cooling performance in the related art are described in detail to demonstrate the superiority of the loop heat pipe 30 according to the disclosure to the related art.

In the related art, when a large amount of vapor V is generated from inside the wick 5, the vapor V fills the liquid-side manifold 11, blocking supply of fluid to the wick 5. Then, the amount of fluid supplied to each individual wick 5, and the amount of evaporation become out of balance, and when the wick 5 is completely exhausted, circulation of the coolant stops, causing loss of the cooling function of the loop heat pipe 30. In the loop heat pipe 30 according to the disclosure, even when vapor forms inside the wick 50, the vapor does not block supply of fluid. Thus, the supply of fluid is continued, the wick 50 does not become exhausted, and the coolant continues to circulate. Therefore, even under such conditions that would cause the cooling function of the loop heat pipe 30 to stop in the related art, in an example of the loop heat pipe 30 according to the disclosure, the cooling function may be maintained.

Figure 12A:
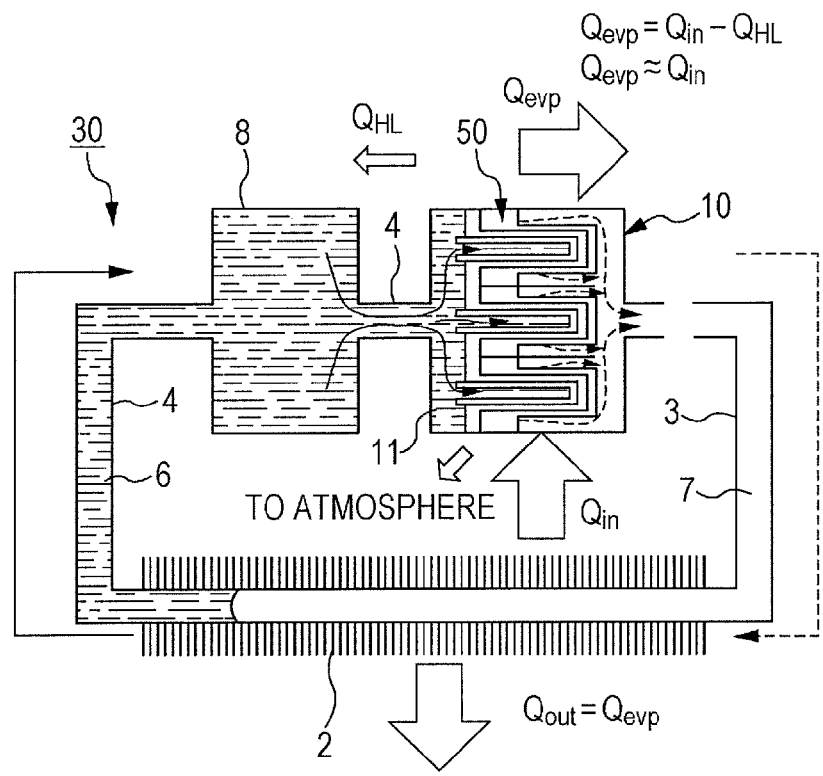
FIG. 12A illustrates the heat transfer capability of the evaporator in an example of the loop heat pipe according to the disclosure.
Figure 12B:
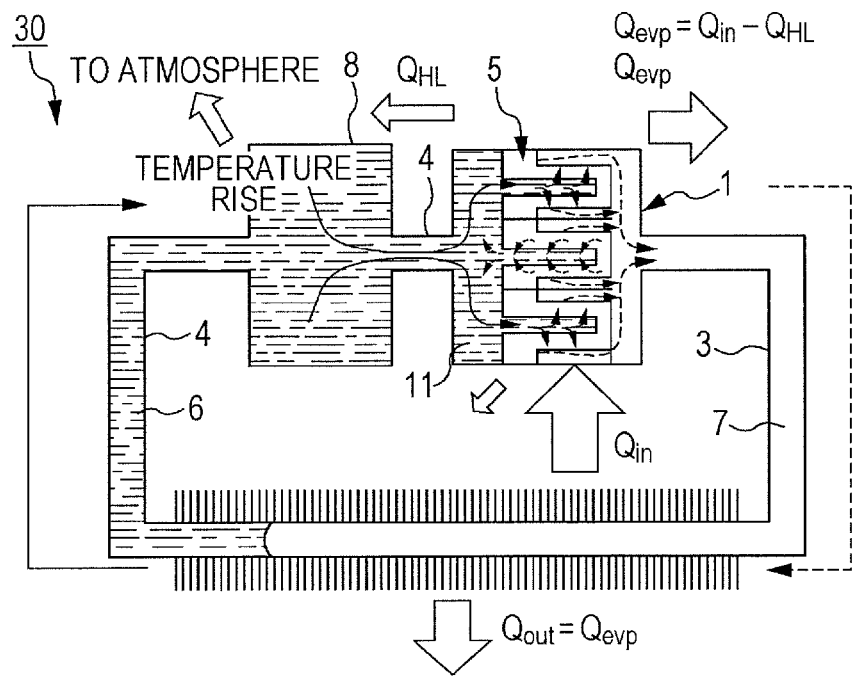
FIG. 12B illustrates the heat transfer capability of the evaporator in the loop heat pipe according to the related art.

Next, the amount of heat transported is compared between the related art and an example of the loop heat pipe 30 according to the disclosure, with respect to a case in which vapor forms inside the wick 5, 50 but the amount of the vapor generated is relatively small, and supply of fluid is being continued. FIGS. 12A and 12B illustrate a comparison of the amount of heat transported $Q_{out}$ relative to the amount of input heat $Q_{in}$, between an example of the loop heat pipe 30 according to the disclosure and the related art. The amount of heat $Q_{out}$ that may be transported from the evaporator 10 to the condenser 2 in the loop heat pipe 30 is the amount of heat $Q_{evp}$ that has been used for evaporation of the working fluid 6 in the evaporator 10, which equals the amount of input heat $Q_{in}$ minus heat leakage $Q_{HL}$ from the evaporator 10. Therefore, by making the heat leakage $Q_{HL}$ from the evaporator 10 smaller, the ratio of the amount of heat $Q_{evp}$ used for evaporation of the working fluid 6 to the amount of input heat $Q_{in}$ may be made larger, thereby improving the cooling performance of the loop heat pipe 30.

The heat leakage $Q_{HL}$ may be expressed as the following equation.

$$Q_{HL}=Q_{case}+Q_{wick}+Q_{vflow}$$

In the above equation, $Q_{case}$ denotes heat transfer between the evaporator case and the compensation chamber case, $Q_{wick}$ denotes heat transfer in the radial direction of the wick 5, 50, and $Q_{vflow}$ denotes heat transfer due to movement of vapor from the wick 5, 50 to the compensation chamber 8. Of these, the first two are determined by the material and geometrical shape of each of the evaporator case, the compensation chamber 8, and the wick 5, 50, and physical properties of the working fluid 6. Use of the same material with a similar shape does not result in much difference between the related art and an example of the loop heat pipe 30 according to the disclosure.

In this regard, in a case where there is not much vapor generated inside the wick 5, 50, and movement of heat to the compensation chamber 8 may be ignored, $Q_{HL}=Q_{case}+Q_{wick}$. Generally, in a case where there is no generation of vapor, and the loop heat pipe 30 is operating properly, the heat leakage $Q_{HL}$, i.e. the sum of the heat transfer $Q_{case}$ between the evaporator case and the compensation chamber case and the heat transfer $Q_{wick}$ in the radial direction of the wick 5, 50 is several percent of the amount of input heat $Q_{in}$. For example, in a case where the sum of the heat transfer $Q_{case}$ between the evaporator case and the compensation chamber case and the heat transfer $Q_{wick}$ in the radial direction of the wick 5, 50 is about 5% of the amount of input heat $Q_{in}$, for a heat input of 300 W, 285 W of heat is transported in both the techniques according to the disclosure and the related art. Hereinafter, the amount of heat transported $Q_{out}$ is compared between the two techniques, with respect to a case where there is a marked flow of vapor into the compensation chamber 8 in the related art.

Figure 13A:
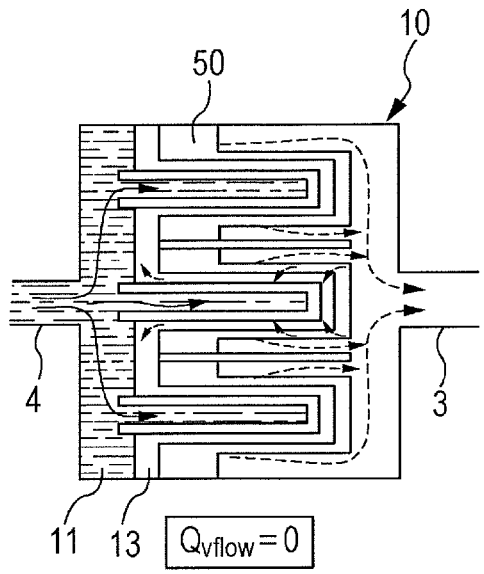
FIGS. 13A and 13B illustrate heat transfer due to movement of vapor from the wick to the compensation chamber in an example of the loop heat pipe according to the disclosure.
Figure 13B:
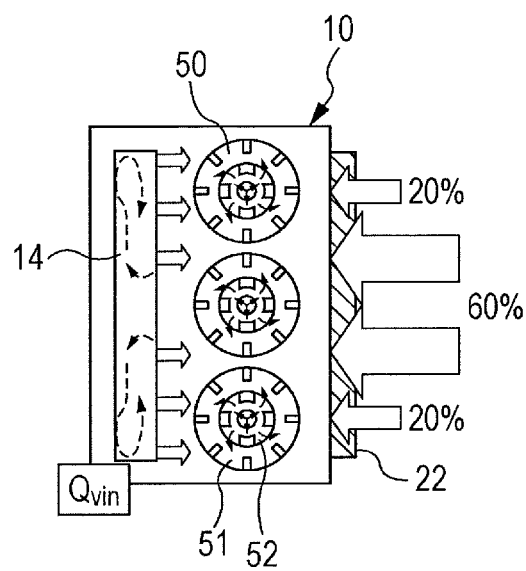
Figure 13C:
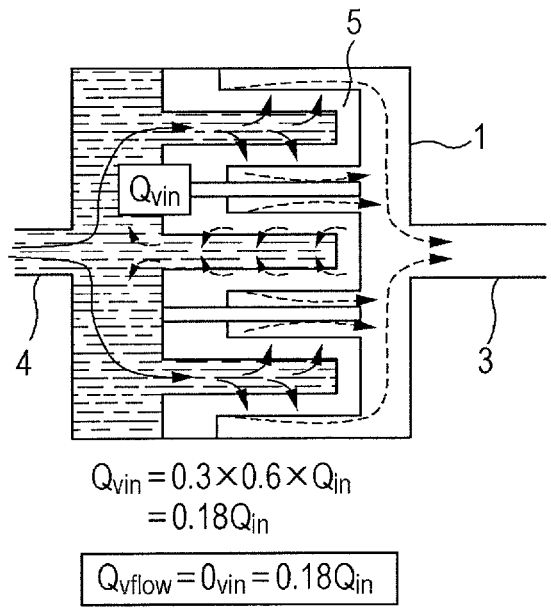
FIGS. 13C and 13D illustrate heat transfer due to movement of vapor from the wick to the compensation chamber in the loop heat pipe according to the related art.
Figure 13D:
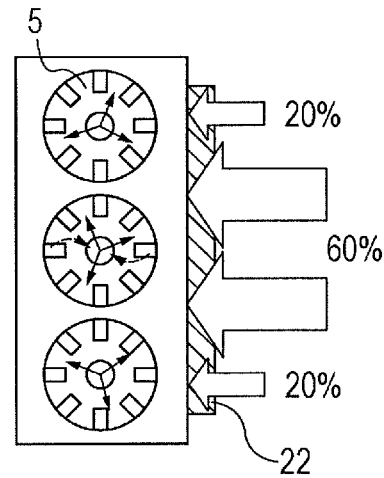

FIGS. 13A to 13D illustrate a comparison of the ratio of heat transfer $Q_{vflow}$ due to movement of vapor from the wick 5, 50 to the compensation chamber 8, to the amount of input heat $Q_{in}$, between the related art and an example of the loop heat pipe 30 according to the disclosure. For example, FIGS. 13A and 13B illustrate the wick 50 in an example of the loop heat pipe 30 according to the disclosure, and FIGS. 13C and 13D illustrate the wick 5 according to the related art. Now, suppose that an amount of heat equal to 60% of the amount of input heat $Q_{in}$ is inputted to the wick 5, 50 in the middle and, further, 30% of that amount of heat flows into the inside owing to partial exhaustion of the wick 5, 50 in the middle. In this case, in the wick 5 according to the related art, 18% of the amount of input heat $Q_{in}$ moves to the compensation chamber 8 via the liquid-side manifold 11 as heat transfer $Q_{vflow}$ due to movement of vapor to the compensation chamber 8 (not illustrated) from the wick 5. In the wick 50 in an example of the loop heat pipe 30 according to the disclosure, for example, the generated vapor moves to the heat dispersion cavity 14 through the communication channel 13, and does not move to the compensation chamber 8. Thus, the amount of heat $Q_{vflow}$ that moves to the compensation chamber 8 due to vapor is zero.

In the following, a comparison of the amount of heat transported $Q_{out}$ is made for a case where the amount of input heat $Q_{in}$ is 300 W, and the sum of heat transfer $Q_{case}$ between the evaporator case and the compensation chamber case and heat transfer $Q_{wick}$ in the radial direction of the wick 5, 50 is 5% of the amount of input heat $Q_{in}$.

(Related Art)

$$Q_{out}=Q_{in}-Q_{HL}=Q_{in}-(Q_{case}+Q_{wick}+Q_{vflow})=Q_{in}-0.05\times Q_{in}-0.18\times Q_{in}=0.77Q_{in}=231\ W$$

(Example of Loop Heat Pipe According to Disclosure)

$$Q_{out}=Q_{in}-Q_{HL}=Q_{in}-(Q_{case}+Q_{wick}+Q_{vflow})=Q_{in}-0.05\times Q_{in}-0\times Q_{in}=0.96Q_{in}=285\ W$$

From the above comparison of the amount of heat transported $Q_{out}$, it is appreciated that in an example of the loop heat pipe 30 according to the disclosure, the amount of heat transported at normal operation may be maintained by suppressing transfer of heat due to flow of vapor into the compensation chamber 8. As another index of the cooling performance of a loop heat pipe, a thermal resistance is used. A thermal resistance is obtained by dividing the temperature difference between an evaporator and a condenser by the amount of input heat. The smaller the thermal resistance, the smaller the temperature difference used to transport heat, thereby allowing efficient heat dissipation.

In the related art, as illustrated as FIGS. 13C and 13D, the vapor generated inside the wick 5 moves to the compensation chamber 8 (see FIG. 1A) through the liquid-side manifold 11. The heat possessed by the vapor that has flown into the compensation chamber 8 causes the temperature of the working fluid 6 that has built up in the compensation chamber 8 to rise. As the temperature of the working fluid 6 rises, the temperature of evaporation from the surface of the wick 5 also rises. Consequently, when there is a flow of vapor into the compensation chamber 8 from the wick 5, for the same amount of heat generation, the temperature of the evaporator 1 rises. Therefore, in the related art, when vapor forms inside the wick 5 and this vapor flows into the compensation chamber 8, the temperature difference between the evaporator 1 and the condenser 2 increases for the same amount of heat generation, causing an increase in thermal resistance between the evaporator 1 and the condenser 2.

In an example of the loop heat pipe 30 according to the disclosure, for example, as illustrated as FIGS. 13A and 13B, the vapor generated inside the wick 50 does not reach the liquid-side manifold 11, and is diffused into the heat dispersion cavity through the communication channel 13. As a result, flow of the vapor generated inside the wick 50 into the compensation chamber 8 is suppressed. Thus, an increase in thermal resistance due to such flow of vapor does not occur, making it possible to maintain thermal resistance at normal operation.

Figure 14:
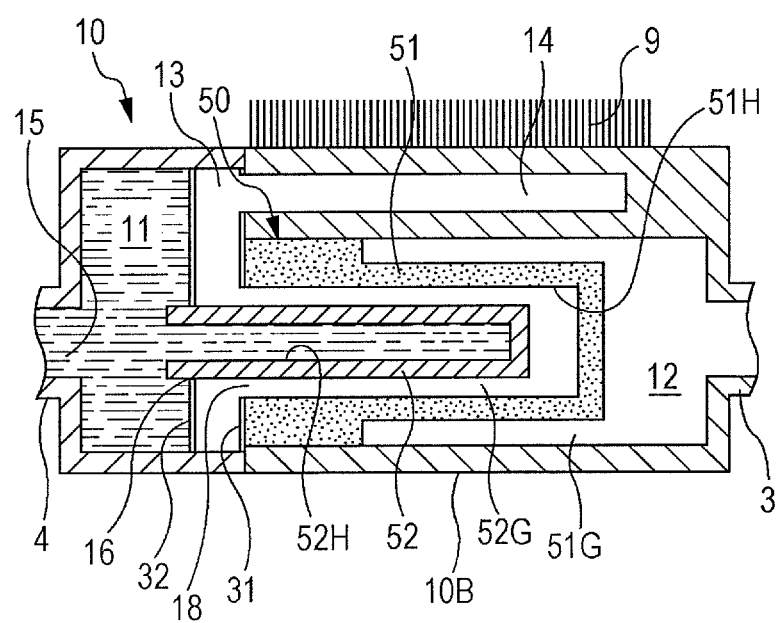
FIG. 14 is a cross-sectional view illustrating an embodiment in which a radiator fin for dissipating heat is attached near the heat dispersion cavity of the evaporator in the loop heat pipe according to the disclosure.

FIG. 14 illustrates a modified embodiment of the evaporator 10 of the loop heat pipe 30 according to the disclosure. In the modified embodiment, a radiator fin 9 for dissipating heat is attached near the heat dispersion cavity 14, on the outer surface of the evaporator 10 opposite to the bottom 10B. Since the configuration of the evaporator 10 other than the radiator fin 9 has already been described with reference to FIG. 7A, a description of such configuration is omitted here. The presence of the radiator fin 9 causes the temperature in the portion of the evaporator 10 near the heat dispersion cavity 14 to drop. As a result, the vapor that has flown into the heat dispersion cavity 14 is allowed to condense. The vapor that has condensed turns into the working fluid 6, and thus may be returned to the second wick 52 through the communication channel 13.

Figure 15A:
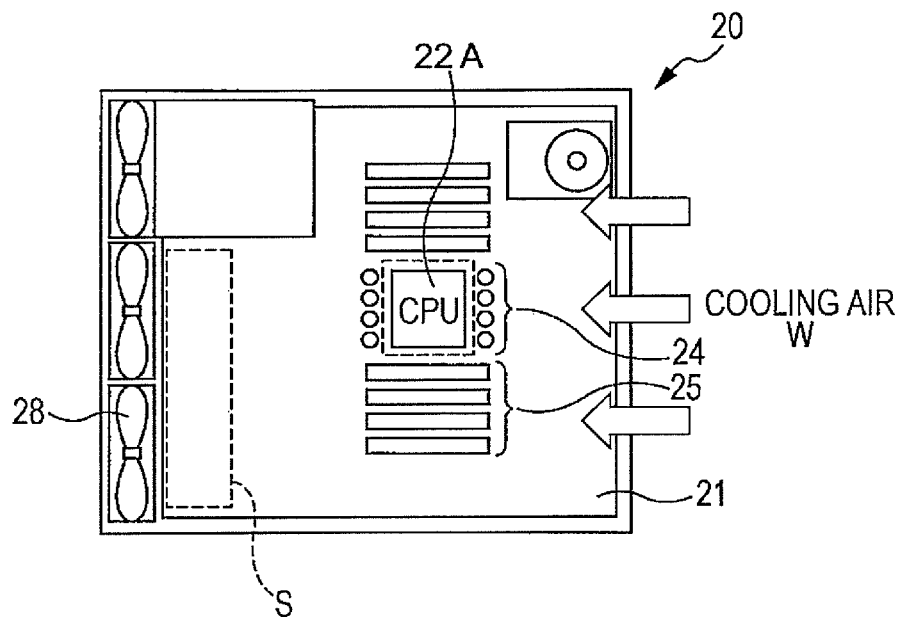
FIG. 15A is a cross-sectional plan view of an electronic apparatus to which an example of the loop heat pipe according to the disclosure may be applied.

FIG. 15A is a plan view of the interior of an electronic apparatus 20 to which an example of the loop heat pipe 30 according to the disclosure may be applied. An air cooling system is widely used as a method of cooling the electronic apparatus 20 such as a computer or a central processor unit (CPU) 22A as the integrated circuit in the electronic apparatus 20. Hereinafter, the integrated circuit is called sometimes as the CPU 22A. In the air cooling system, a heat sick is mounted directly on the CPU 22A, and the integrated circuit is cooled by directing cooling air W onto the integrated circuit. In the case of cooling a high-heat generating CPU, the heat sink is to be increased in size to increase the heat dissipation area, or the flow rate of the cooling air W is to be increased. Normally, memories 25 and other electronic components 24 are densely placed on the portion of the circuit board 21 near the CPU 22A, and it is difficult to secure a cavity for installation of a large heat sink. Also, to increase the flow rate of the cooling air W, the rotation speed of a cooling fan 28 is to be increased, which leads to an increase in the electric power used to perform cooling. Further, as the flow rate increases, the cooling fan 28 generates more wind noise. From the viewpoint of the recent trend toward power saving and silent operation of the electronic apparatus 20, improving cooling performance by increasing flow rate is not a favorable solution.

To achieve such cooling of a high-heat generating circuit component, it is effective to employ a cooling system that exploits a heat transport device that may efficiently transport the heat generated by the CPU 22A to a position away from the area directly above the CPU 22A. Generally, there is more cavity S available near the cooling fan 28 installed on the housing of the electronic apparatus 20, than in the area near the CPU 22A. Therefore, if the heat generated in the CPU 22A may be transported from the area directly above the CPU 22A to the area near the cooling fan 28 with high efficiency, heat may be dissipated using a heat sink with a large heat dissipation area, and cooling may be performed with a low flow rate, thereby achieving power saving and silent operation. Further, the cavity inside the housing of the electronic apparatus 20 may be effectively utilized, thereby also enabling cavity saving for the housing.

Examples of a heat transfer device include a liquid circulation system that drives a liquid coolant by a pump to circulate the coolant within a channel, and the loop heat pipe 30 according to the disclosure. The loop heat pipe 30 according to the disclosure does not use external electric power to circulate the coolant, and thus may perform cooling with low power consumption. Lately, there has been a growing trend toward multi-core designs of the CPU 22A for improved processing performance of the electronic apparatus 20. As the amount of heat generated by each core increases, a non-uniform heat generation distribution develops on the surface of the CPU 22A. As described above, although the loop heat pipe 30 including the evaporator 1 with the plurality of built-in wicks 5 may adapt to cooling of high heat generated by the CPU 22A, in the presence of a non-uniform heat generation distribution on the surface to be cooled, operation of the loop heat pipe 30 becomes unstable, resulting in a drop in cooling performance.

Figure 15B:
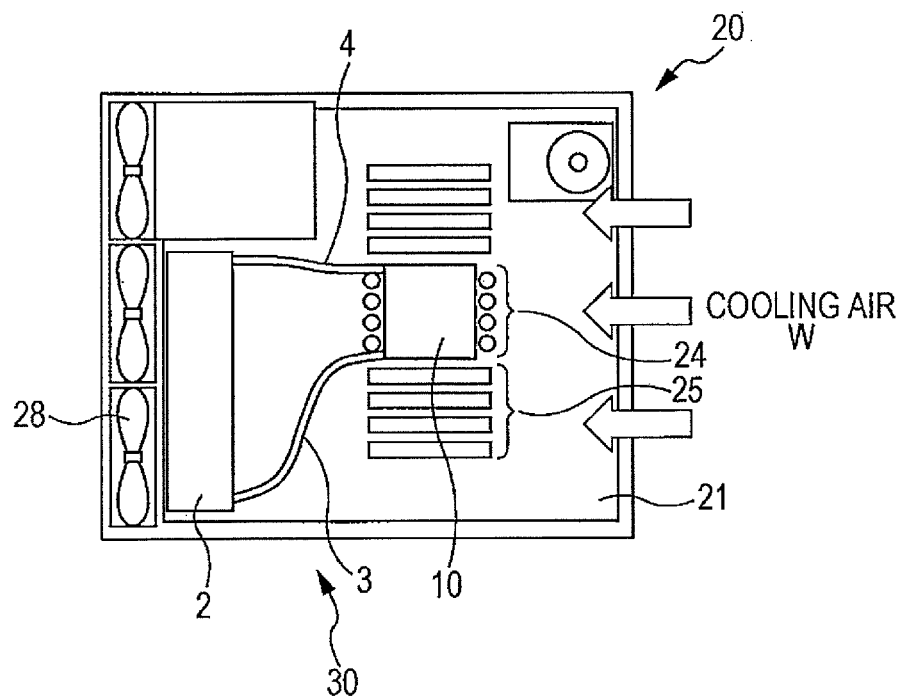
FIG. 15B is a cross-sectional plan view illustrating a state in which the loop heat pipe according to the disclosure is attached to the electronic apparatus illustrated as FIG. 15A.

FIG. 15B illustrates, as opposed to the above-mentioned electronic apparatus 20, the electronic apparatus 20 that uses the loop heat pipe 30 according to the disclosure illustrated as FIGS. 5 to 14 in which the evaporator 10 and the condenser 2 are connected to each other by the vapor pipe 3 and the liquid pipe 4. Use of the loop heat pipe 30 according to the disclosure makes it possible to perform cooling with low power consumption in the electronic apparatus 20 installed with a high-heat generating, multi-core CPU 22A. Further, use of the loop heat pipe 30 according to the disclosure makes it possible to achieve a highly reliable cooling system that operates in a stable manner and does not decrease in cooling performance even when a non-uniform heat generation distribution develops on the CPU 22A.

While the above description of the embodiment is directed to use of the loop heat pipe 30 in a computer as an example of the electronic apparatus 20, the electronic apparatus 20 to which the loop heat pipe 30 may be applied may be other than a computer, and the electronic apparatus 20 is not limited to a computer. It may be easily appreciated that the loop heat pipe 30 including the evaporator 10 according to the disclosure may be effectively applied to any electronic apparatus installed with a high-heat generating processor.

Figure 16A:
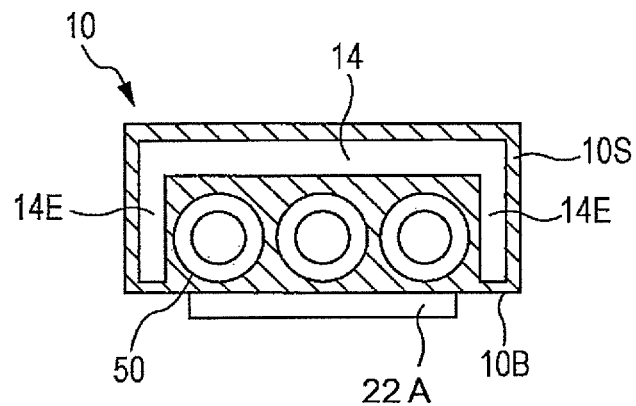
FIG. 16A is a cross-sectional view illustrating the configuration of a modified embodiment of the evaporator in the loop heat pipe according to the disclosure.
Figure 16B:
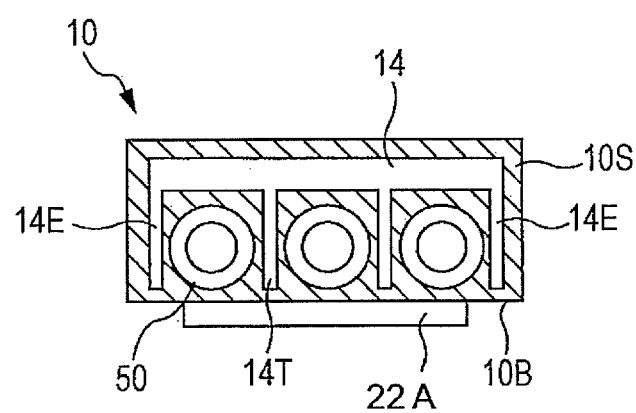
FIG. 16B is a cross-sectional view illustrating the configuration of another modified embodiment of the evaporator in the loop heat pipe according to the disclosure.

The above description of the embodiments is directed to the configuration in which the heat dispersion cavity 14 is placed so as to cover the plurality of wicks 50, near the side of the evaporator 10 opposite to the bottom 10B through which heat is inputted from the integrated circuit or the CPU 22A. In this regard, as illustrated as FIG. 16A, the heat dispersion cavity 14 may be implemented in an embodiment in which the heat dispersion cavity 14 has an extension 14E provided along a side face 10S of the evaporator 10. Further, as illustrated as FIG. 16B, the heat dispersion cavity 14 may be implemented in an embodiment in which the heat dispersion cavity 14 has, in addition to the extension 14E provided along the side face 10S of the evaporator 10, an extension 14T provided in the portion of the wick accommodating section 10W between the wick 50 and the wick 50. Also, the number of wicks 50 is not limited to three.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
    an evaporator that internally includes at least one wick built;
    a condenser;
    a liquid pipe and a vapor pipe that connect the evaporator and the condenser to each other; and
    a heat dispersion cavity that is formed inside the evaporator, and disperses a vapor,
    wherein the wick includes,
    a first wick that is porous,
    a second wick that is porous, the second wick being inserted into the first wick from the liquid pipe side and including a pore size larger than the first wick, and
    a vapor channel that is defined between the first wick and the second wick, and
    wherein the vapor channel is connected at an end on the liquid pipe side to the heat dispersion cavity.

2. The loop heat pipe according to claim 1, wherein the evaporator includes a plurality of the wicks, and the vapor channels of the wicks are all connected to the heat dispersion cavity.

3. The loop heat pipe according to claim 1, wherein the first wick has an insertion hole for the second wick, and the vapor channel is also provided between a tip end face of the second wick, and a bottom of the insertion hole of the first wick.

4. The loop heat pipe according to claim 1, further comprising:
    a non-porous plate that covers a surface of the second wick, the surface facing the vapor channel.

5. The loop heat pipe according to claim 1, wherein the heat dispersion cavity is provided side by side and adjacent to the wick, adjacent to a side of the evaporator opposite to a heat input side.

6. The loop heat pipe according to claim 5, wherein the heat dispersion cavity is extended in parallel to the wick, along a side of the evaporator perpendicular to the heat input side.

7. The loop heat pipe according to claim 5, wherein the evaporator includes a wick accommodating section, and in a case where the evaporator has a plurality of wicks, the heat dispersion cavity is extended to a portion of the wick accommodating section between two of the plurality of wicks, the two of the plurality of wicks being adjacent to each other.

8. The loop heat pipe according to any one of claim 1, further comprising:
    a radiator provided on an outer surface of the evaporator adjacent to the heat dispersion cavity.

9. The loop heat pipe according to any one of claim 1, further comprising:
    a compensation chamber provided on the liquid pipe side of the evaporator.

10. An electronic apparatus comprising:
    an electronic component; and
    a loop heat pipe that includes,
    an evaporator that is in thermal contact with the electronic component, and internally includes at least one wick built,
    a liquid pipe and a vapor pipe that connect the evaporator and the condenser to each other, and
    a heat dispersion cavity that is defined inside the evaporator and disperses a vapor,
    wherein the wick includes,
    a first wick that is porous,
    a second wick that is porous, the second wick being inserted into the first wick from the liquid pipe side and including a pore size larger than the first wick, and
    a vapor channel that is defined between the first wick and the second wick, and
    wherein the vapor channel is connected at an end on the liquid pipe side to the heat dispersion cavity.

11. The electronic apparatus according to claim 10, further comprising:
    a circuit board,
    wherein the electronic component is mounted on the circuit board, and
    the evaporator of the loop heat pipe is attached onto the circuit board while contacting the electronic component.

* * * * *